US010916621B2

United States Patent
Koyanagi et al.

(10) Patent No.: US 10,916,621 B2
(45) Date of Patent: Feb. 9, 2021

(54) CAPACITOR INCLUDING FIRST ELECTRODE, SECOND ELECTRODE, AND DIELECTRIC LAYER, IMAGE SENSOR, AND METHOD FOR PRODUCING CAPACITOR

(71) Applicant: Panasonic Intellectual Property Management Co., Ltd., Osaka (JP)

(72) Inventors: Takahiro Koyanagi, Osaka (JP); Yuuko Tomekawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/109,809

(22) Filed: Aug. 23, 2018

(65) Prior Publication Data

US 2019/0081130 A1    Mar. 14, 2019

(30) Foreign Application Priority Data

Sep. 11, 2017    (JP) .................... 2017-174263

(51) Int. Cl.
*H01L 49/02*    (2006.01)
*H01L 27/146*    (2006.01)
(Continued)

(52) U.S. Cl.
CPC ........ *H01L 28/40* (2013.01); *H01L 21/02181* (2013.01); *H01L 21/02189* (2013.01); *H01L 21/02321* (2013.01); *H01L 21/02332* (2013.01); *H01L 21/31155* (2013.01); *H01L 27/14609* (2013.01); *H01L 27/307* (2013.01); *H01L 28/60* (2013.01)

(58) Field of Classification Search
CPC ....... H01L 21/02321; H01L 21/031155; H01L 21/02181; H01L 21/02332; H01L 21/02189; H01L 28/40; H01L 27/14609; H01L 27/307; H01L 21/3155; H01L 28/60
See application file for complete search history.

(56) References Cited

U.S. PATENT DOCUMENTS

2004/0012043 A1\* 1/2004 Gealy ............... H01L 21/28194
257/303
2006/0051978 A1\* 3/2006 Li ..................... H01L 21/31155
438/785
(Continued)

FOREIGN PATENT DOCUMENTS

JP    11-87634    \* 3/1999
JP    2016-127265    7/2016
(Continued)

OTHER PUBLICATIONS

Hutchinson (Year: 2017).\*
(Continued)

*Primary Examiner* — Ahmed N Sefer
(74) *Attorney, Agent, or Firm* — McDermott Will & Emery LLP

(57) ABSTRACT

A capacitor includes a first electrode, a second electrode facing the first electrode, and a dielectric layer disposed between the first and second electrodes and being in contact with each of the first and second electrodes. The dielectric layer contains at least one element selected from the group consisting of nitrogen and silicon.

16 Claims, 7 Drawing Sheets

(51) Int. Cl.
  *H01L 21/3115* (2006.01)
  *H01L 27/30* (2006.01)
  *H01L 21/02* (2006.01)

(56) References Cited

U.S. PATENT DOCUMENTS

| | | | | |
|---|---|---|---|---|
| 2007/0048953 | A1* | 3/2007 | Gealy | C23C 16/45529 |
| | | | | 438/305 |
| 2008/0297982 | A1* | 12/2008 | Umemoto | H01G 9/0032 |
| | | | | 361/524 |
| 2009/0057737 | A1* | 3/2009 | Boescke | H01L 28/40 |
| | | | | 257/295 |
| 2013/0208403 | A1* | 8/2013 | Rocklein | H01L 28/40 |
| | | | | 361/321.5 |
| 2016/0005961 | A1* | 1/2016 | Ino | H01L 45/04 |
| | | | | 257/4 |
| 2016/0105622 | A1* | 4/2016 | Tamaki | H04N 5/3696 |
| | | | | 348/322 |
| 2016/0293654 | A1* | 10/2016 | Tomekawa | H01L 27/14643 |
| 2017/0125405 | A1 | 5/2017 | Tanaka et al. | |
| 2017/0180657 | A1* | 6/2017 | Tashiro | H04N 5/3575 |
| 2017/0186365 | A1 | 6/2017 | Yoneda | |
| 2017/0222056 | A1 | 8/2017 | Sawai et al. | |
| 2019/0081131 | A1* | 3/2019 | Tokuhara | H01L 28/40 |
| 2019/0148390 | A1* | 5/2019 | Frank | H01L 21/02282 |
| | | | | 257/295 |

FOREIGN PATENT DOCUMENTS

| | | |
|---|---|---|
| JP | 2017-085106 | 5/2017 |
| JP | 2017-120412 | 7/2017 |
| JP | 2017-139459 | 8/2017 |

OTHER PUBLICATIONS

Soon-Wook Kim et al., "Effects of electrical stress on the leakage current characteristics of multilayer capacitor structures", Applied Physics Letters 96, 262904, Jul. 1, 2010.

T. S. Boscke et al., "Ferroelectricity in Hafnium Oxide: CMOS compatible Ferroelectric Field Effect Transistors", IEEE, IEDM11, 547-550, Dec. 5, 2011.

* cited by examiner

ION IMPLANTATION

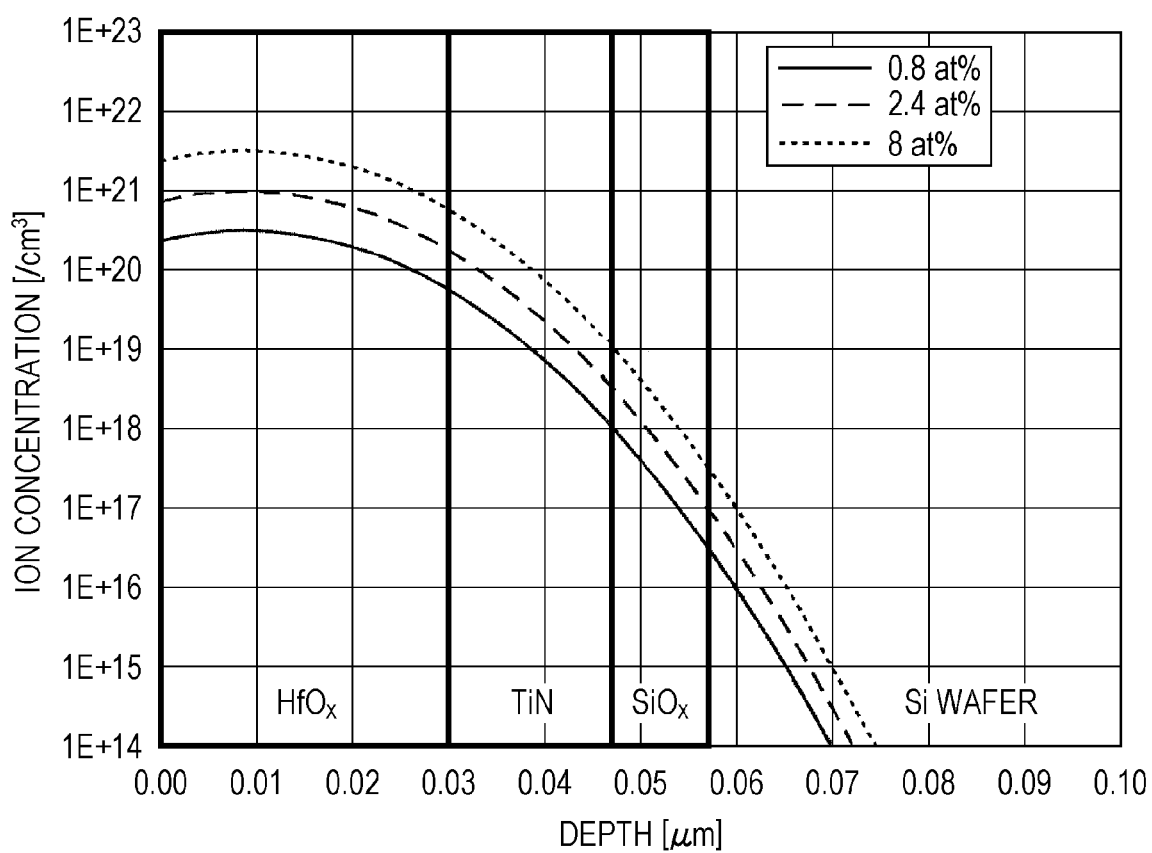

CAPACITOR INCLUDING FIRST ELECTRODE, SECOND ELECTRODE, AND DIELECTRIC LAYER, IMAGE SENSOR, AND METHOD FOR PRODUCING CAPACITOR

BACKGROUND

1. Technical Field

The present disclosure relates to a capacitor, an image sensor, and a method for producing a capacitor.

2. Description of the Related Art

In an effort to improve the density of semiconductor integrated circuits (ICs), researchers have been working for higher capacitance densities per unit area of capacitors in a semiconductor IC. A measure currently under research is to make an insulating film in a capacitor from a material having a high permittivity. For example, the following publications disclose capacitors that have an insulating film made from hafnium oxide ($HfO_2$), whose permittivity is higher than that of commonly used silicon oxide ($SiO_2$): Soon-Wook Kim, "Effects of electrical stress on the leakage current characteristics of multilayer capacitor structures," Appl. Phys. Lett. 96, 262904, 2010 and T. S. Boscke, "Ferroelectricity in Hafnium Oxide: CMOS compatible Ferroelectric Field Effect Transistors," IEEE, IEDM, 11, 547-550, 2011.

SUMMARY

In one non-limiting and exemplary general aspect, the techniques disclosed here feature a capacitor. The capacitor includes a first electrode, a second electrode facing the first electrode, and a dielectric layer disposed between the first and second electrodes and being in contact with each of the first and second electrodes. The dielectric layer contains at least one element selected from the group consisting of nitrogen and silicon.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 7 is a graph illustrating an example of a distribution of concentrations of implanted ions in the direction of depth in a capacitor according to an embodiment;

DETAILED DESCRIPTION

Figure 1:
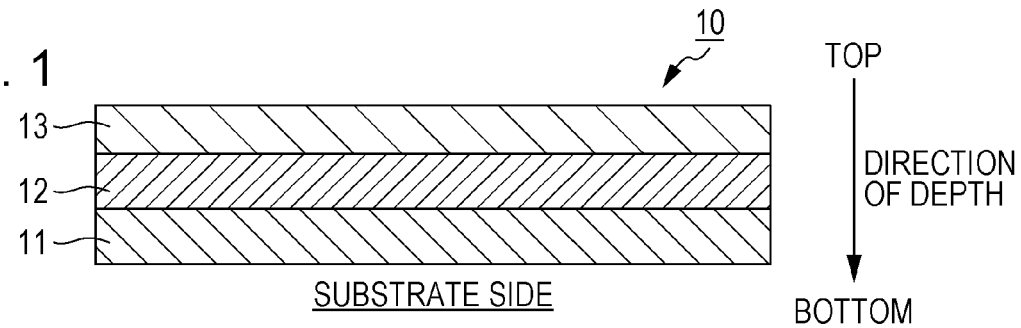
FIG. 1 is a cross-sectional diagram illustrating an example of a cross-sectional structure of a capacitor according to an embodiment.

Underlying Knowledge Forming Basis of the Present Disclosure

The capacitance C of a capacitor is expressed by $C=\varepsilon \times \varepsilon_0 \times S/t$, where $\varepsilon$ denotes the permittivity of the dielectric layer between the electrodes, $\varepsilon_0$ vacuum permittivity, t the thickness of the dielectric layer, and S the electrode area. This means that the capacitance can be increased not only by increasing the permittivity $\varepsilon$ of the dielectric layer but also by, for example, reducing the thickness t of the dielectric layer.

Additionally, a typical way to increase the withstand voltage of a capacitor is to thicken the dielectric layer or use a low-permittivity material, which has a broad band gap. The withstand voltage is a voltage limit above which the leakage current flowing between the electrodes increases significantly.

However, as stated in Kim's article, a film of hafnium oxide ($HfO_2$) becomes lower in withstand field strength with increasing thickness. The withstand field strength is the field strength above which the leakage current increases significantly, and is used synonymously with withstand voltage. A dielectric layer made of hafnium oxide is therefore disadvantageous in that thickening it rather reduces its withstand voltage.

An aspect of the disclosure can be outlined as follows.

A capacitor according to an aspect of the present disclosure includes a first electrode, a second electrode facing the first electrode, and a dielectric layer disposed between the first and second electrodes and being in contact with each of the first and second electrodes. The dielectric layer contains at least one element selected from the group consisting of nitrogen and silicon. The dielectric layer may contain the at least one element as an impurity.

This aspect provides a capacitor good in withstand voltage characteristics. The at least one element selected from nitrogen or silicon contained in the dielectric layer fills imperfections existing in the dielectric layer, reducing current paths being formed and thus increasing the withstand voltage of the capacitor.

In a capacitor according to an aspect of the present disclosure, the dielectric layer may be made of at least one selected from the group consisting of a hafnium oxide and a zirconium oxide. In a capacitor according to an aspect of the present disclosure, the dielectric layer may contain at least one selected from the group consisting of a hafnium oxide and a zirconium oxide as a main component.

This gives the capacitor a high capacitance. Hafnium oxides and zirconium oxides are high-permittivity materials.

In a capacitor according to an aspect of the present disclosure, the dielectric layer may be a layer of a paraelectric material.

Capacitors according to this aspect vary less in capacitance. By virtue of the paraelectricity of the dielectric layer and the associated controlled hysteresis, the capacitor is stable in terms of capacitance properties.

In a capacitor according to an aspect of the present disclosure, the at least one element may have a concentration distribution along a thickness direction of the dielectric layer having a highest peak concentration within the dielectric layer.

In a capacitor according to an aspect of the present disclosure, the capacitor may include a first interface, which is an interface between the dielectric layer and the first electrode and a second interface, which is an interface between the dielectric layer and the second electrode, and the at least one element may be distributed in the dielectric layer from the first interface to the second interface.

This makes the capacitor better in withstand voltage characteristics. The imperfections in the dielectric layer are sufficiently filled in the direction of thickness, and, therefore, current paths that are formed between the electrodes are further reduced.

In a capacitor according to an aspect of the disclosure, an elemental percentage of the at least one element in the dielectric layer may be 0.8 atomic % or more and 25 atomic % or less in the dielectric layer.

This gives the capacitor a high capacitance combined with a high withstand voltage. The interstitial sufficiently fills the imperfections in the dielectric layer owing to its percentage being 0.8 atomic % (at %) or more, without compromising the high permittivity of the hafnium oxide or zirconium oxide owing to its percentage being 25 at % or less.

It should be noted that thickening a dielectric layer makes it crystallize. A capacitor having a crystallized dielectric layer exhibits a low withstand voltage compared with one that has a thin, amorphous dielectric layer. In this aspect, however, the nitrogen or silicon added to the dielectric layer fills imperfections existing in the layer, reducing leakage current. This aspect thus helps increase the withstand voltage of a capacitor even if it has a crystallized dielectric layer.

In a capacitor according to an aspect of the present disclosure, the first and second electrodes may, for example, each include a metal nitride film.

This is an easy way to produce a capacitor good in withstand voltage characteristics. Metal nitride films are highly compatible with semiconductor processes.

An image sensor according to an aspect of the present disclosure includes a photoelectric transducer and an above-described capacitor.

This image sensor has enhanced properties owing to the good withstand voltage characteristics of the capacitor.

A method according to an aspect of the present disclosure for producing a capacitor includes forming a first electrode, forming a dielectric layer on the first electrode, adding at least one element selected from the group consisting of nitrogen and silicon to the dielectric layer, and forming a second electrode on the dielectric layer.

A capacitor produced by this method is good in withstand voltage characteristics.

In a method according to an aspect of the present disclosure, the adding the at least one element may be performed by ion implantation.

This makes the capacitor better in withstand voltage characteristics. Ion implantation helps the nitrogen or silicon spread inside the dielectric layer sufficiently, ensuring satisfactory filling of imperfections in the dielectric layer in the direction of thickness. As a result, current paths that are formed between the electrodes are further reduced.

In ion implantation, moreover, it is easy to control the distribution of concentrations of nitrogen or silicon added to the dielectric layer. This means that the manufacturer can position the peak in the concentration distribution on the first interface side or second interface side of the dielectric layer, whichever contains more imperfections. The ion implantation may be done once or twice or more. When ions are implanted twice or more, the implantation conditions may be fixed or changed from time to time. The distribution of concentrations of nitrogen or silicon added may have one or two or more peaks.

The distribution of concentrations of nitrogen or silicon added, moreover, may exhibit a monotonic decrease or monotonic increase from the first interface toward the second interface of the dielectric layer. This helps arrange the concentration distribution for the most effective filling of imperfections in the dielectric layer, and the resulting capacitor is better in withstand voltage.

In a method according to an aspect of the present disclosure for producing a capacitor, the dielectric layer may be made of at least one selected from the group consisting of a hafnium oxide and a zirconium oxide. In a method according to an aspect of the present disclosure for producing a capacitor, the dielectric layer may contain at least one selected from the group consisting of a hafnium oxide and a zirconium oxide as a main component.

The following describes embodiments of the present disclosure in detail, with reference to drawings. It should be noted that the following embodiments are all general or specific examples, in which the numerical values, shapes, materials, elements, arrangements of and connections between elements, production steps, orders of production steps, and the like are illustrative and not intended to limit any aspect of the disclosure. The various aspects set forth herein can be combined unless contradictory. Moreover, those elements in the following embodiments that are not recited in an independent claim, which defines the most generic concept, are described as optional.

The drawings are schematic and are not necessarily precise. For example, the drawings are not necessarily true to scale. Functionally equivalent elements may hereinafter be referenced by the same designator throughout the drawings so that duplicate explanations can be omitted or brief.

The terms "above" and "below" as mentioned herein are not in the absolute upward and downward directions (vertically upward and downward directions, respectively) but are defined by the relative positions of layers in the multilayer structure, which are based on the order of stacking of the layers. The terms "above" and "below," moreover, are used to describe not only a situation in which two elements are spaced with another element therebetween, but also a situation in which two elements are in contact with each other.

EMBODIMENTS

FIG. 1 is a cross-sectional diagram illustrating an example of a cross-sectional structure of a capacitor 10 according to an embodiment.

As illustrated in FIG. 1, the capacitor 10 has a lower electrode 11, a dielectric layer 12, and an upper electrode 13. The capacitor 10 is formed by the lower electrode 11, dielectric layer 12, and upper electrode 13 stacked in this order above a substrate (not illustrated).

The lower electrode 11 and upper electrode 13 are an example of first and second electrodes facing each other. The dielectric layer 12 is between the lower electrode 11 and upper electrode 13 and in contact with each of the lower electrode 11 and upper electrode 13.

As illustrated in FIG. 1, the capacitor 10 is a parallel-plate capacitor. Specifically, each of the lower electrode 11, dielectric layer 12, and upper electrode 13 is a flat plate, substantially uniform in thickness. The lower electrode 11 and upper electrode 13 are parallel to each other with the dielectric layer 12 therebetween. The top surface of the lower electrode 11 is in contact with the bottom surface of the dielectric layer 12. The bottom surface of the upper electrode 13 is in contact with the top surface of the dielectric layer 12.

The electrode area of the capacitor 10 corresponds to the area of overlap between the upper electrode 13 and lower electrode 11 in plan view, or the area of overlap as measured when the capacitor 10 is viewed in the direction of stacking. The direction of stacking is opposite the direction of depth in FIG. 1, i.e., the direction from bottom to top.

The lower electrode 11 is an example of a first electrode the capacitor 10 includes. The lower electrode 11 is made of an electroconductive material. Examples include metals, such as titanium (Ti), aluminum (Al), gold (Au), and platinum (Pt), electroconductive metal nitrides, such as titanium nitride (TiN), tantalum nitride (TaN), and hafnium nitride (HfN), and electroconductive oxides, such as indium tin oxide (ITO) and zinc oxide (ZnO).

The lower electrode 11 is formed by depositing a thin film of an electroconductive material, for example above a substrate, by metal organic chemical vapor deposition (MOCVD), atomic layer deposition (ALD), sputtering, or any other process. The thickness of the lower electrode 11 is 30 nm for example, but other thicknesses are also possible.

The upper electrode 13 is an example of a second electrode the capacitor 10 includes. The material for the upper electrode 13 can be the same as or different from that for the lower electrode 11. The upper electrode 13 is formed by depositing a thin film of an electroconductive material, for example over a region of the dielectric layer 12 overlapping with the lower electrode 11 in plan view, using a process such as MOCVD, ALD, or sputtering similar to the lower electrode 11. The thickness of the upper electrode 13 is 200 nm for example, but other thicknesses are also possible.

The dielectric layer 12 is a layer of a high-k material, a material that exhibits a higher permittivity than silicon oxide ($SiO_2$). Specifically, the dielectric layer 12 is made primarily of an oxide of hafnium (Hf) or zirconium (Zr). The mole percentage of the oxide of hafnium or zirconium in the dielectric layer 12 is 50% or more. The dielectric layer 12 is formed by depositing a thin dielectric film from the oxide of zirconium or hafnium, for example on the lower electrode 11, by ALD, MOCVD, EB (electron beam) deposition, or any other process.

The dielectric layer 12 is monoclinic in crystallographic structure. The dielectric layer 12 is a paraelectric material.

The dielectric layer 12 contains nitrogen (N) or silicon (Si) added thereto. Specifically, the nitrogen or silicon is distributed inside the dielectric layer 12 from a first interface as the interface between the dielectric layer 12 and lower electrode 11 to a second interface as the interface between the dielectric layer 12 and upper electrode 13. More specifically, the elemental percentage of the nitrogen or silicon in the dielectric layer 12 is 0.8 at % or more and 25 at % or less. For example, when ion implantation is used to add nitrogen or silicon to the dielectric layer 12, the dose of nitrogen or silicon ions implanted into the dielectric layer 12 is $1 \times 10^{15}/cm^2$ or more.

The thickness of the dielectric layer 12 can be measured as, for example, a physical thickness observed in a transmission electron microscope (TEM) image of the layer. When the area (S) of the capacitor 10 and the permittivity (ε) of the dielectric layer 12 are known, the thickness can alternatively be calculated as an average thickness (t) from the capacitance (C) of the capacitor 10 according to the equation $t = \varepsilon \times S/C$.

The crystallographic structure of the dielectric layer 12 can be identified by analyzing the layer by x-ray diffraction (XRD). Cross-sectional TEM can also be used.

The concentration of nitrogen or silicon in the dielectric layer 12 can be measured by, for example, time-of-flight secondary ion mass spectrometry (ToF-SIMS). Other methods may also be used to measure the thickness, identify the crystallographic structure, and determine the nitrogen or silicon content of the dielectric layer 12.

It should be noted that FIG. 1 is not the only possible cross-sectional structure of the capacitor 10. The following describes variations of cross-sectional structures of the capacitor 10 with reference to FIGS. 2 to 5. FIGS. 2 to 5 illustrate other examples of cross-sectional structures of a capacitor according to this embodiment.

The capacitors 10a, 10b, 10c, and 10d in these drawings are all parallel-plate capacitors. The capacitors 10a, 10b, 10c, and 10d are different from the capacitor 10 in cross-sectional structure and equivalent to the capacitor 10 in other respects such as the function of and material for each layer and the method for production.

Figure 2:
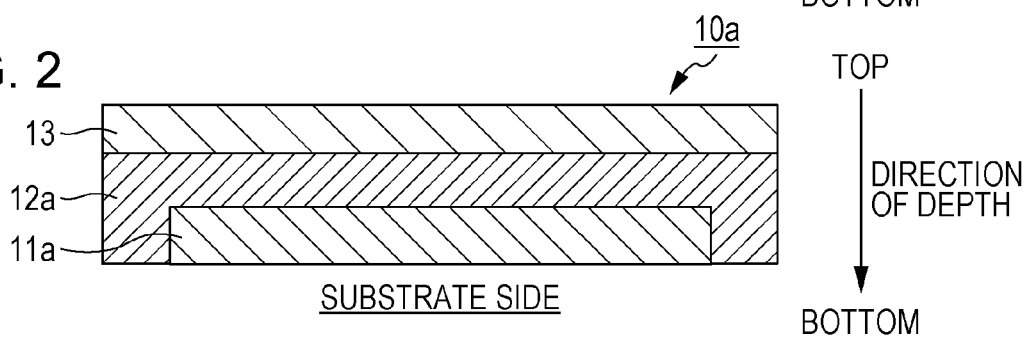
FIG. 2 is a cross-sectional diagram illustrating another example of a cross-sectional structure of a capacitor according to an embodiment.

The capacitor 10a in FIG. 2 includes a lower electrode 11a, a dielectric layer 12a, and an upper electrode 13. As illustrated in FIG. 2, the lower electrode 11a is smaller than the upper electrode 13 and dielectric layer 12a. For example, the lower electrode 11a lies inside the upper electrode 13 and also inside the dielectric layer 12a in plan view.

The lower electrode 11a is covered by the dielectric layer 12a. Specifically, the dielectric layer 12a covers the top and side surfaces of the lower electrode 11a. The dielectric layer 12a and upper electrode 13 are the same size in plan view.

Figure 3:
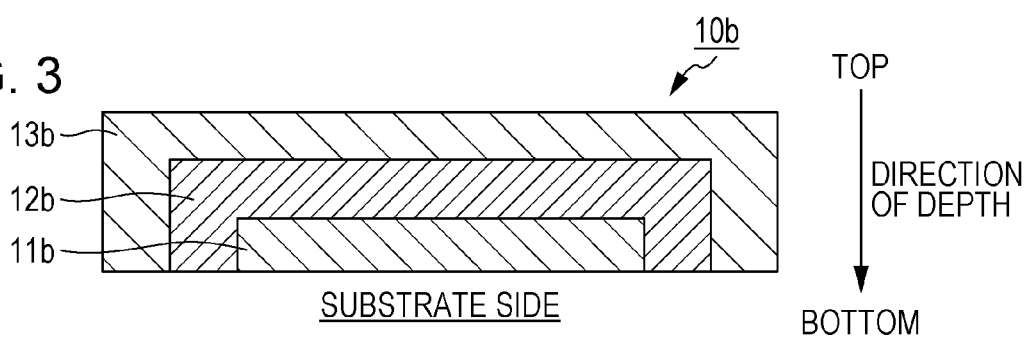
FIG. 3 is a cross-sectional diagram illustrating yet another example of a cross-sectional structure of a capacitor according to an embodiment.

The capacitor 10b in FIG. 3 includes a lower electrode 11b, a dielectric layer 12b, and an upper electrode 13b. As illustrated in FIG. 3, the lower electrode 11b is smaller than the upper electrode 13b and dielectric layer 12b. For example, the lower electrode 11b lies inside the upper electrode 13b and also inside the dielectric layer 12b in plan view. The lower electrode 11b is covered by the dielectric layer 12b. Specifically, the dielectric layer 12b covers the top and side surfaces of the lower electrode 11b.

Additionally, the dielectric layer 12b is smaller than the upper electrode 13b. For example, the dielectric layer 12b lies inside the upper electrode 13b in plan view. The dielectric layer 12b is covered by the upper electrode 13b. Specifically, the upper electrode 13b covers the top and side surfaces of the dielectric layer 12b.

Figure 4:
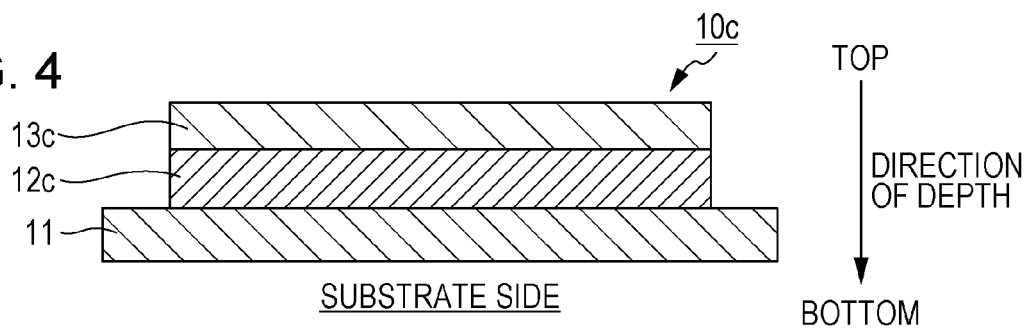
FIG. 4 is a cross-sectional diagram illustrating still another example of a cross-sectional structure of a capacitor according to an embodiment.

The capacitor 10c in FIG. 4 includes a lower electrode 11, a dielectric layer 12c, and an upper electrode 13c. As illustrated in FIG. 4, the upper electrode 13c and dielectric layer 12c are smaller than the lower electrode 11. For example, the upper electrode 13c and dielectric layer 12c lie inside the lower electrode 11 in plan view. The upper electrode 13c and dielectric layer 12c are the same size in plan view.

Figure 5:
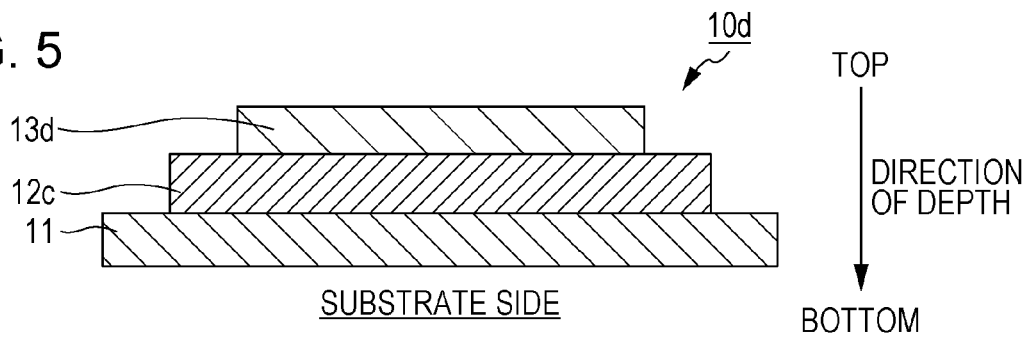
FIG. 5 is a cross-sectional diagram illustrating a further example of a cross-sectional structure of a capacitor according to an embodiment.

The capacitor 10d in FIG. 5 includes a lower electrode 11, a dielectric layer 12c, and an upper electrode 13d. As illustrated in FIG. 5, the upper electrode 13d and dielectric layer 12c are smaller than the lower electrode 11. For example, the upper electrode 13d and dielectric layer 12c lie inside the lower electrode 11 in plan view. Additionally, the upper electrode 13d is smaller than the dielectric layer 12c. For example, the upper electrode 13d lies inside the dielectric layer 12c in plan view.

Next, a method for producing a capacitor 10 according to this embodiment is described with reference to FIGS. 6A to 6D. FIGS. 6A to 6D are cross-sectional diagrams illustrating a method for producing a capacitor 10 according to this embodiment step by step.

The method for producing a capacitor 10 includes stacking a lower electrode 11, a dielectric layer 12, and an upper electrode 13 in this order and adding nitrogen or silicon to the dielectric layer 12. To produce any of the capacitors 10a, 10b, 10c, and 10d in FIGS. 2 to 5, the manufacturer only needs to arrange the stacking of the lower electrode, dielectric layer, and upper electrode, for example by changing the shape of the masks used to pattern these layers.

Figure 6A:
FIG. 6A is a cross-sectional diagram illustrating a step in a method for producing a capacitor according to an embodiment.

First, as illustrated in FIG. 6A, a lower electrode 11 is formed above a substrate (not illustrated), for example by depositing a TiN film by ALD. The thickness of the TiN film is 15 nm for example, but other thicknesses are also possible.

Figure 6B:
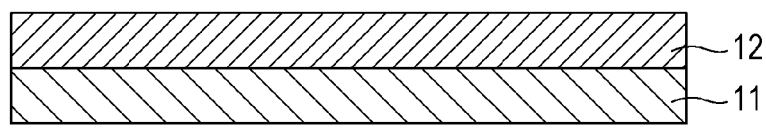
FIG. 6B is a cross-sectional diagram illustrating a step in a method for producing a capacitor according to an embodiment.

Then, as illustrated in FIG. 6B, a dielectric layer 12 is formed on the lower electrode 11 by ALD. The substrate temperature is, for example, 250° C. or more and 300° C. or less. In an example, a film of a hafnium oxide ($HfO_x$) is deposited on the lower electrode 11 to form the dielectric layer 12. A film of a zirconium oxide ($ZrO_x$) may be deposited instead of the hafnium oxide film. The thickness of the $HfO_x$ film is 25.2 nm for example, but other thicknesses are also possible. The subscript x in $HfO_x$ and $ZrO_x$ is a positive number. An example is x=2, but other values are also possible.

Figure 6C:
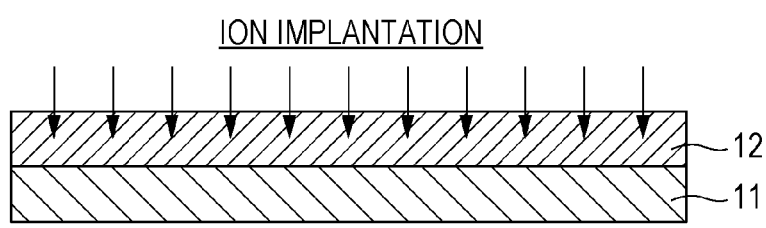
FIG. 6C is a cross-sectional diagram illustrating a step in a method for producing a capacitor according to an embodiment.

Then, as illustrated in FIG. 6C, nitrogen or silicon is added to the dielectric layer 12, specifically by ion implantation.

Figure 6D:
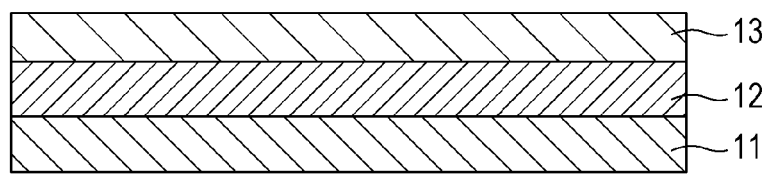
FIG. 6D is a cross-sectional diagram illustrating a step in a method for producing a capacitor according to an embodiment.

Then, as illustrated in FIG. 6D, an upper electrode 13 is formed on the nitrogen- or silicon-implanted dielectric layer 12, for example by depositing a TiN film on the dielectric layer 12 by ALD. The thickness of the TiN film is 70 nm for example, but other thicknesses are also possible.

The resulting capacitor 10 may be subjected to thermal treatment in a nitrogen ($N_2$) atmosphere, or nitrogen annealing. The temperature and duration of the nitrogen annealing are, for example, 400° C. and 30 minutes.

In this embodiment, the capacitor 10 is not subjected to thermal treatment at a high temperature. The high temperature here falls within the range of temperatures at which the dielectric layer 12 cannot maintain paraelectricity, and an example is 1000° C. Thermal treatment at 1000° C. would change the crystallographic condition of the dielectric layer 12 from monoclinic to orthorhombic. The change in its crystallographic condition would make the dielectric layer 12 ferroelectric, and the ferroelectric dielectric layer 12 would exhibit hysteresis. Nitrogen annealing or any other heat treatment of the capacitor 10 is therefore performed at a temperature of, for example, 400° C. or less.

The following describes Examples of the present disclosure. These Examples are preferred illustrations intended to provide an explanation of the present disclosure and do not limit any aspect of the disclosure.

The inventors fabricated sample capacitors 10 according to Examples 1 to 3, described hereinafter, and a sample capacitor according to the Comparative Example and evaluated the characteristics of these samples. The procedure followed to produce these samples is detailed first.

Example 1

First, on a substrate that was a Si wafer, a TiN film as the lower electrode 11 was deposited to a thickness of 15 nm. Then a film of $HfO_x$ as the dielectric layer 12 was deposited to a thickness of 20 nm. Nitrogen was then added to the dielectric layer 12 until the proportion of Ni to $HfO_x$ was 2.4 at %.

FIG. 7 is a graph illustrating an example of a distribution of implanted ions in the direction of depth in a capacitor 10 according to this embodiment. Specifically, FIG. 7 illustrates simulated distributions, in the direction of depth, of N ions implanted into a 30-nm thick $HfO_x$ film under the following conditions: energy, 4 keV; implantation dose, $1\times10^{15}/cm^2$, $3\times10^{15}/cm^2$, or $1\times10^{16}/cm^2$. In FIG. 7, the horizontal axis represents depth [μm], and the vertical axis ion concentration [/cm$^3$]. The simulated nitrogen levels in a $HfO_x$ film implanted with N ions at doses of $1\times10^{15}/cm^2$, $3\times10^{15}/cm^2$, and $1\times10^{16}/cm^2$ are 0.8 at %, 2.4 at %, and 8 at %, respectively. The nitrogen levels in a $HfO_x$ film were determined from the ratio between the maximum concentration of N ions in the $HfO_x$ film and the density of the $HfO_x$ film: $4.57\times10^{22}/cm^3$.

Based on the simulation results in FIG. 7, in the fabrication of the sample according to Example 1, N ions were implanted at a dose of $3\times10^{15}/cm^2$ and an energy of 4 keV.

Figure 8:
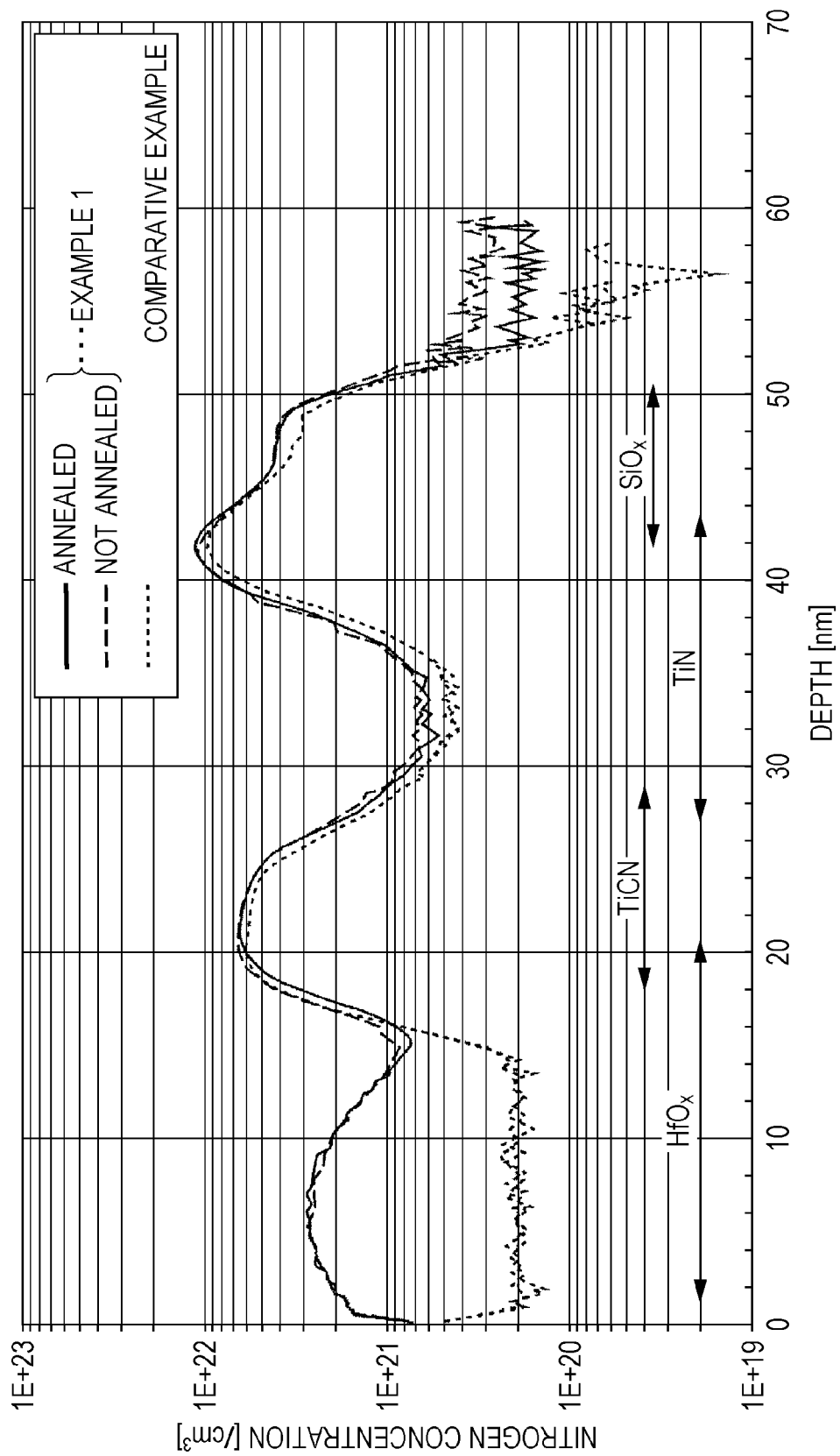
FIG. 8 is a graph illustrating an example of a distribution of concentrations of nitrogen in the direction of depth in a capacitor according to an embodiment.

Subsequently, a TiN film as the upper electrode 13 was deposited to a thickness of 70 nm. The resulting structure was subjected to thermal treatment in a nitrogen atmosphere at 400° C. for 30 minutes, completing the capacitor 10 according to Example 1. As shown in FIG. 8, the capacitor 10 according to Example 1 contained 5.9 at % nitrogen in the $HfO_x$ film.

The $HfO_x$ dielectric film 12 was deposited by ALD from TEMAH ($Hf[NCH_3C_2H_5]_4$, tetrakis(ethylmethylamino)hafnium). Feedstock gas and $O_3$ gas were introduced into a chamber alternately to grow into a $HfO_x$ film on the lower electrode 11. The starting material may alternatively be TDMAH ($Hf[N(CH_3)_2]_4$, tetrakis(dimethylamino)hafnium).

The TiN films that served as the lower electrode 11 and upper electrode 13 were each deposited by MOCVD from TDMAT ($Ti[N(CH_3)_2]_4$, tetrakis(dimethylamido)titanium).

Separately, samples for film analysis were prepared by the same procedure as the capacitor 10 according to Example 1, except that the upper electrode 13 was not formed.

Example 2

In Example 2, a capacitor 10 was fabricated as in Example 1 but the ion implantation dose was changed. Specifically, N ions were implanted at a dose of $1\times10^{15}/cm^2$ and an energy of 4 keV. The proportion of implanted N ions to $HfO_x$ in the capacitor 10 according to Example 2 was 0.8 at %.

Example 3

In Example 3, a capacitor 10 was fabricated as in Example 2 but the ion species added was changed. Specifically, the dielectric layer 12 was implanted with silicon (Si) instead of nitrogen. The dielectric layer 12 in the capacitor 10 according to Example 3 therefore contained Si, and the proportion of implanted Si ions to $HfO_x$ was 0.8 at %.

Comparative Example

To obtain Comparative Example, the inventors additionally fabricated a capacitor in which the dielectric layer 12 contained no nitrogen or silicon added thereto. The capacitor according to the Comparative Example was fabricated by the same procedure as in Example 1, but no N ions were added to the $HfO_x$ film.

Separately, a sample for film analysis was fabricated by the same procedure as the capacitor according to the Comparative Example, except that the upper electrode 13 was not formed.

The following describes the results of characterization of the fabricated capacitors according to Examples 1 to 3 and Comparative Example. First, measured distributions of concentrations of nitrogen added to the dielectric layer 12 are discussed with reference to FIG. 8.

FIG. 8 is a graph illustrating an example of a distribution of concentrations of nitrogen in the direction of depth in a capacitor 10 according to this embodiment. Specifically, FIG. 8 illustrates the secondary-ion mass spectrometry (SIMS)-based distribution of concentrations of nitrogen in the samples for film analysis prepared in Example 1 and Comparative Example. It should be noted that FIG. 8 includes two distributions of concentrations of nitrogen for the capacitor 10 according to Example 1, from samples obtained with and without nitrogen annealing after the fabrication of the capacitor 10 (annealed and not annealed, respectively).

As can be seen from FIG. 8, the samples according to Example 1 contained more nitrogen in the hafnium oxide film than that according to the Comparative Example. In the $HfO_x$ film in the samples according to Example 1, the nitrogen concentration increased gradually, peaked, and then decreased gradually with increasing depth. The peak was observed at approximately 6 nm deep, with the concentration of N ions there being approximately $3\times10^{21}/cm^3$. The samples according to Example 1 exhibited substantially identical concentration distributions, with or without nitrogen annealing.

FIG. 8 also indicates that at the interface between the $HfO_x$ and TiN films was a film of a nitride of titanium containing carbon (C), or a TiCN film. Carbon came from the starting materials for the MOCVD of the TiN film and the ALD of the $HfO_x$ film.

The $HfO_x$ film therefore functioned as a dielectric layer 12 in the range of depths down to approximately 15 nm, at which the nitrogen concentration reached a minimum. In other words, the interface between the dielectric layer 12 and lower electrode 11 was at approximately 15 nm deep in FIG. 8. As can be seen from this, nitrogen was distributed inside the dielectric layer 12 from the interface with the lower electrode 11 to that with the upper electrode 13, or across the entire depth of the $HfO_x$ film.

Next, the voltage-current characteristics of the capacitors according to Examples 1 to 3 and Comparative Example are discussed with reference to FIG. 9.

Figure 9:
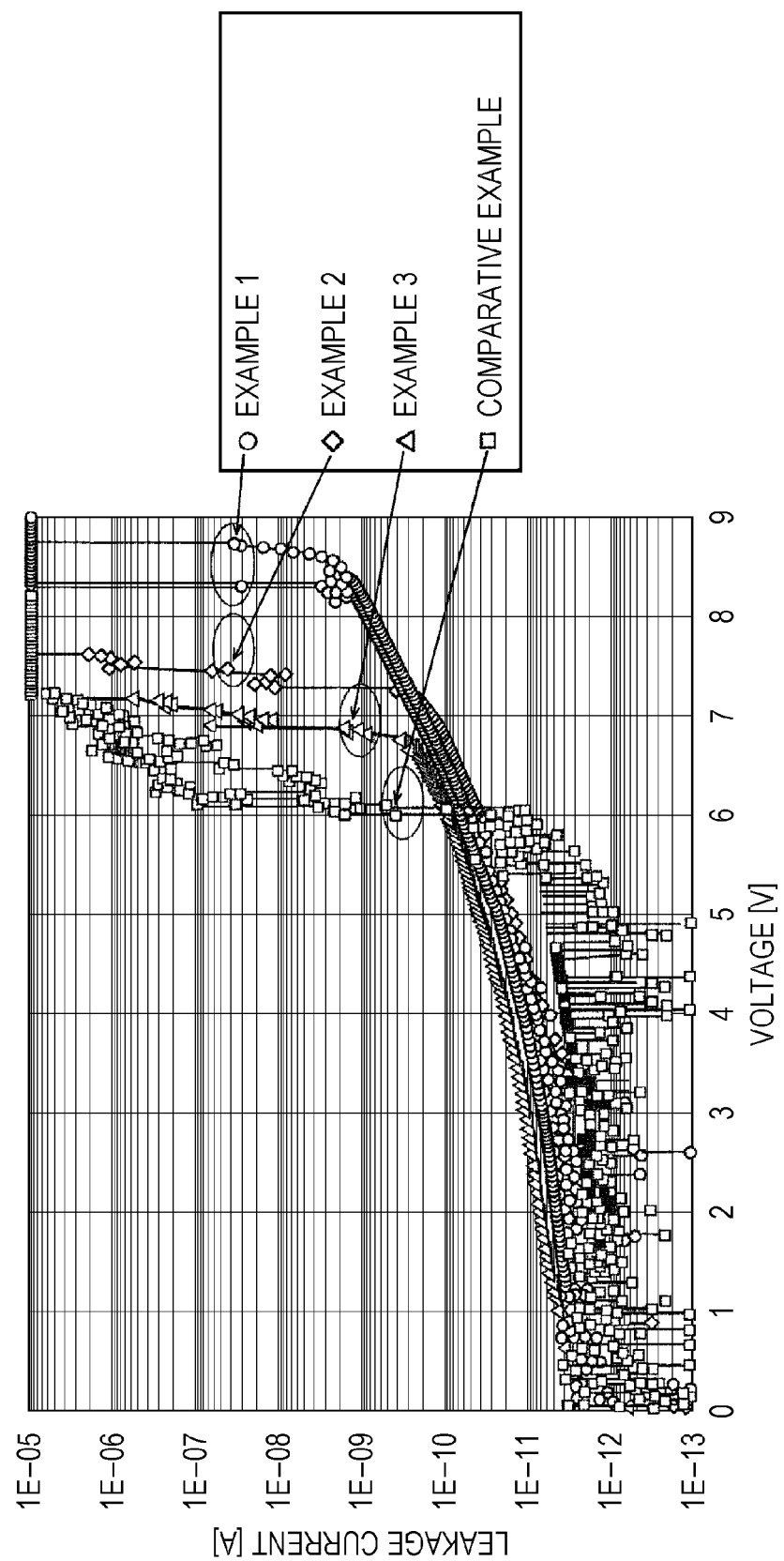
FIG. 9 is a graph illustrating an example of voltage-current characteristics of capacitors according to an embodiment.

FIG. 9 is a graph illustrating an example of voltage-current characteristics of capacitors 10 according to this embodiment. Specifically, FIG. 9 illustrates the voltage-current characteristics of Examples 1 to 3 and Comparative Example. The current values were measured using Keysight 4156C semiconductor parameter analyzer by monitoring, at one to three points per sample, leakage current flowing between the lower electrode 11 and upper electrode 13 while sweeping the voltage applied to the upper electrode 13 from 0 V to 9 V with 0 V applied to the lower electrode 11.

In Comparative Example, the leakage current increased significantly at voltages of approximately 6 V and above. In Examples 1, 2, and 3, the leakage current increased significantly at voltages of approximately 8.2 V and above, 7.2 V and above, and 6.8 V and above, respectively. These voltages are the withstand voltages of the samples. The withstand field strength converted from the withstand voltage was approximately 2.3 MV/cm for Comparative Example, approximately 3.2 MV/cm for Example 1, approximately 2.8 MV/cm for Example 2, and approximately 2.6 MV/cm for Example 3.

Overall, improved withstand voltage was observed in all of Examples 1 to 3, in which $HfO_x$ was implanted with N or Si ions.

In Examples 2 and 3, the capacitors were fabricated by the same procedure except that different ion species were added. When Examples 2 and 3 are compared, therefore, it is clear that Ni ions improved withstand voltage more effectively than Si ions.

In Examples 1 and 2, the capacitors were fabricated by the same procedure except that different doses of N ions were implanted. From this it is shown that the withstand voltage characteristics of a capacitor can be controlled by adjusting the implantation dose or, more specifically, that the withstand voltage was improved more effectively in Example 1, in which the implantation dose was higher, than in Example 2, in which the implantation dose was lower.

Next, the voltage-capacitance characteristics of a capacitor 10 according to this embodiment are discussed with reference to FIG. 10.

Figure 10:
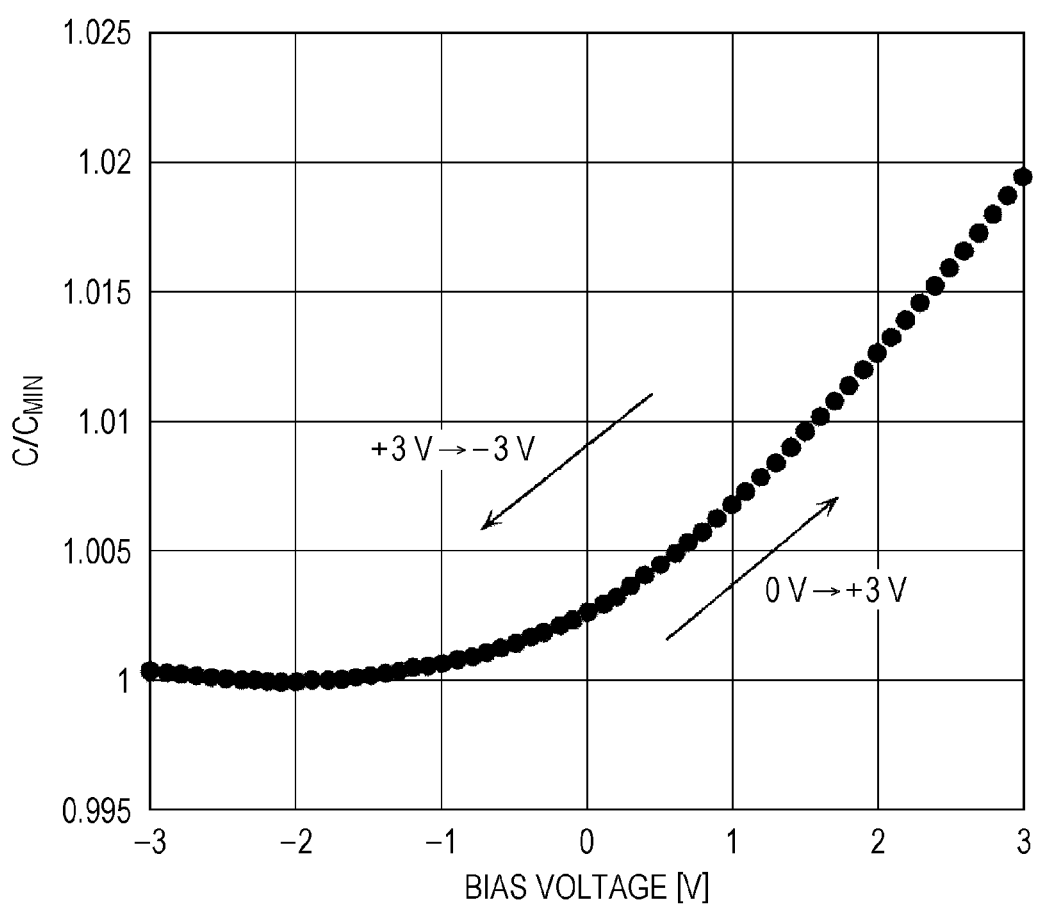
FIG. 10 is a graph illustrating an example of voltage-capacitance characteristics of a capacitor according to an embodiment.

FIG. 10 is a graph illustrating an example of voltage-capacitance characteristics of a capacitor 10 according to this embodiment. Specifically, FIG. 10 illustrates the voltage-capacitance characteristics of Example 1. In FIG. 10, the horizontal axis represents the bias voltage, which is the voltage applied to the electrodes, and the vertical axis the ratio of the measured capacitance C to the minimum measured capacitance $C_{MIN}$.

In this test, the capacitance C of the capacitor 10 was measured while the voltage applied to the upper electrode 13 was swept from 0 V to +3 V, from +3 V to −3 V, and from −3 V to 0 V with 0 V applied to the lower electrode 11. The minimum capacitance $C_{MIN}$ occurred at a voltage of approximately −2 V.

As can be seen from FIG. 10, the rise (0 V→+3 V) and fall (+3 V→−3 V) in voltage gave identical capacitance curves. The capacitor 10 according to Example 1 was therefore not hysteretic, and this is because the dielectric layer 12 was a paraelectric material.

It should be noted that in Examples a hafnium oxide ($HfO_x$) was used as the material for the dielectric layer 12, but a zirconium oxide ($ZrO_x$) also works. $ZrO_x$ closely resembles $HfO_x$ in characteristics: $ZrO_x$ has a permittivity of roughly 30, a band gap of 6.0 eV, is monoclinic or tetragonal in crystallographic structure, and, in the form of film, becomes more crystallized with increasing thickness, whereas $HfO_x$ has a permittivity of roughly 20, a band gap of 5.8 eV, is monoclinic in crystallographic structure, and, in the form of film, becomes more crystallized with increasing thickness. Even with $ZrO_x$, therefore, it is expected that the withstand voltage will be improved as with $HfO_x$.

Likewise, TiN, used as the material for the lower electrode 11 and upper electrode 13 owing to its compatibility with semiconductor processes, may be replaced with another metal nitride, such as TaN.

Moreover, ion implantation is not the only possible method for adding nitrogen or silicon. Other methods can also be used, such as plasma treatment and gas exposure of the film during deposition.

A proposed model for the breakdown of $HfO_x$ is the percolation model. In the percolation model, dielectric breakdown occurs as a result of imperfections caused by prolonged stress creating current paths. The percolation model also applies to capacitors 10 according to this embodiment.

In light of this, the inventors believe that the improved withstand voltage observed with the addition of nitrogen or silicon to the dielectric layer 12 resulted from the ions added to the dielectric layer 12 filling imperfections and thereby reducing current paths being formed. Therefore, the region of the dielectric layer 12 to which nitrogen or silicon ions are added may be the entire depth of the dielectric layer 12, i.e., the depth from the interface with the lower electrode 11 to that with the upper electrode 13, over which this layer acts as a capacitor, or the nitrogen or silicon ions may be added to at least the interfaces of the dielectric layer 12 with the lower electrode 11 and upper electrode 13.

The concentration of ions added to the dielectric layer 12 is not critical as long as a stoichiometric excess of ions are added. For example, as demonstrated by Example 2, adding at least 0.8 at % ions is sufficient for a meaningful effect. The elemental composition of the dielectric layer 12 can be 25 at % or more Hf, 50 at % or more O, and 25 at % or less N.

Figure 11:
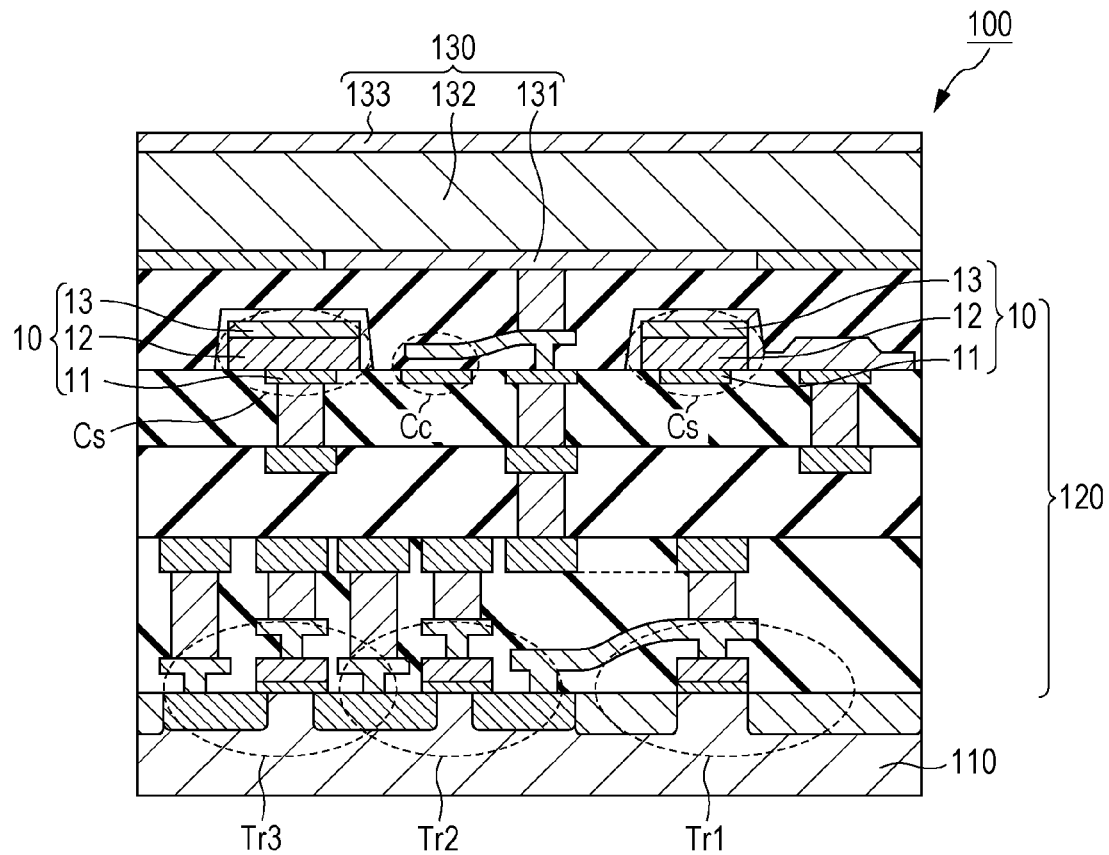
FIG. 11 is a cross-sectional diagram illustrating the cross-sectional structure of an image sensor that includes a capacitor according to an embodiment.

Next, an image sensor 100 including a capacitor 10 according to this embodiment is described with reference to FIG. 11. FIG. 11 is a cross-sectional diagram illustrating the cross-sectional structure of an image sensor 100 according to an embodiment.

The image sensor 100 includes multiple pixels arranged in a matrix. Each pixel includes a photoelectric transducer, which produces an electrical signal from light it receives, and a pixel circuit that processes the electrical signal produced by the photoelectric transducer. FIG. 11 illustrates the cross-sectional structure of a pixel in the image sensor 100.

As illustrated in FIG. 11, an image sensor 100 according to this embodiment is a multilayer image sensor that has a photoelectric transducing film 132 deposited above a pixel circuit. Specifically, the image sensor 100 includes a substrate 110, a multilayer wiring structure 120, and a photoelectric transducer 130.

The substrate 110 is a semiconductor substrate, such as a Si substrate.

The multilayer wiring structure 120 includes a pixel circuit that processes an electrical signal produced by the photoelectric transducer 130, specifically multiple transistors Tr1, Tr2, and Tr3, multiple capacitors Cs and Cc, and multiple wiring lines as illustrated in FIG. 11.

Each of the transistors Tr1, Tr2, and Tr3 is a resetting transistor, a transistor for charge readout, or a transistor for any other purpose. The transistors Tr1, Tr2, and Tr3 are MOSFETs for example. The source and drain regions, for example, of each transistor are in the superficial region of the substrate 110.

The capacitor Cc stores signal charge taken out of the photoelectric transducer 130, and the capacitors Cs remove kTC noise. The transistors, capacitors, and wiring lines are separated from each other by an interlayer insulating film made from an insulator, such as a silicon oxide film.

The photoelectric transducer 130 includes a pixel electrode 131, a photoelectric transducing film 132, and a transparent electrode 133. The pixel electrode 131 and transparent electrode 133 face each other with the photoelectric transducing film 132 therebetween. The photoelectric transducing film 132 is in surface contact with each of the pixel electrode 131 and transparent electrode 133.

Each pixel has its own pixel electrode 131 separated from the other pixels'. The pixel electrode 131 is made of, for example, metal, such as aluminum or copper, or any other electroconductive material.

The photoelectric transducing film 132 is a film of an inorganic material, such as amorphous silicon, or an organic material. When light is incident through the transparent electrode 133, the photoelectric transducing film 132 produces signal charge whose output varies with the amount of light. The signal charge is taken out through the pixel electrode 131 and stored in the capacitor Cc.

The transparent electrode 133 is made of a transparent electroconductive material, such as ITO. The transparent electrode 133 and photoelectric transducing film 132 are, for example, shared by each pixel.

By way of example, the capacitors Cs can be capacitors 10 according to the above embodiment. Specifically, the image sensor 100 includes the capacitors 10 as the capacitors for removing kTC noise as illustrated in FIG. 11. To form each capacitor 10, a lower electrode 11, a dielectric layer 12, and an upper electrode 13 are stacked in this order anywhere above the substrate 110 and inside the multilayer wiring structure 120.

Alternatively, the capacitor Cc, for storing signal charge, may be a capacitor 10. This helps prevent whiteout in the case of high-intensity incident light, ensuring high saturation capacity of the pixels.

By virtue of the high withstand voltage of the capacitor(s) 10, the image sensor 100 according to this embodiment is highly reliable.

Other Embodiments

Although the foregoing has described embodiments of a capacitor, an image sensor, and a method for producing a capacitor according to one or more aspects, the present disclosure is not limited to these embodiments. The disclosure encompasses any embodiment obtained by making modifications, to an above embodiment, that those skilled in the art could think of or by combining elements in different embodiments unless the embodiment departs from the spirit and scope of the disclosure.

For example, the dielectric layer 12 may be a ferroelectric material.

In another exemplary embodiment, the nitrogen or silicon content of the dielectric layer 12 may be smaller than 0.8 at % or larger than 25 at %.

Moreover, the capacitor 10 may be a non-parallel-plate capacitor. The following describes a capacitor according to a variation of an embodiment with reference to FIG. 12.

Figure 12:
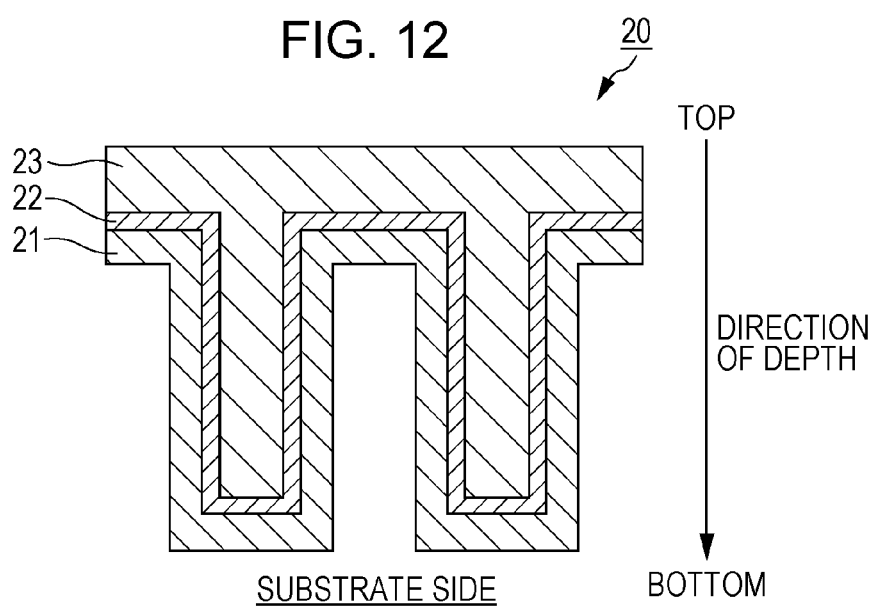
FIG. 12 is a cross-sectional diagram illustrating an example of a cross-sectional structure of a capacitor according to a variation.

FIG. 12 is a cross-sectional diagram illustrating an exemplary structure of a capacitor 20 according to this variation.

The capacitor 20 in FIG. 12 is not a parallel-plate capacitor but a three-dimensionally structured capacitor. Specifically, the capacitor 20 includes a lower electrode 21, a dielectric layer 22, and an upper electrode 23. The capacitor 20 is different from a capacitor 10 according to an embodiment in cross-sectional structure but equivalent to the capacitor 10 in all other respects, such as the material for each layer and the method for production.

As illustrated in FIG. 12, the interface between the lower electrode 21 and dielectric layer 22 has a trenched shape, depressed in part in the direction of depth, or from the upper electrode 23 toward the lower electrode 21. The dielectric layer 22 conforms to this trenched shape and is substantially uniform in thickness. In this variation, the lower electrode 21 also conforms to the trenched shape and is substantially uniform in thickness. The upper electrode 23 has a substantially flat top surface and a bottom surface conforming to the trenched shape.

In this structure, the upper electrode 23 and lower electrode 21 face each other over a larger area because they are opposite along the sides of the trenches as well. The surface area of the capacitor 20 is therefore larger than that of the capacitor 10 in FIG. 1 for the same size in plan view, and so is the capacitance.

Although the trenched shape in FIG. 12 has two trenches, there may be one or three or more trenches. Increasing the number of trenches or creating deeper trenches will increase the capacitance of the capacitor 20.

To each of the foregoing embodiments, various modifications, substitutions, additions, and/or omissions can be made within the scope of the claims or equivalents thereof.

What is claimed is:

1. A capacitor comprising:
a first electrode;
a second electrode facing the first electrode; and
a dielectric layer disposed between the first and second electrodes and being in contact with each of the first and second electrodes, wherein
the dielectric layer contains at least one element selected from the group consisting of nitrogen and silicon, and
a concentration distribution of the at least one element in the dielectric layer along a thickness direction of the dielectric layer includes an upward convex portion, the upward convex portion including a local maximum at a point other than interfaces between the dielectric layer and the first and second electrodes.

2. The capacitor according to claim 1, wherein
the dielectric layer contains the at least one element as an impurity.

3. The capacitor according to claim 1, wherein
the dielectric layer is made of at least one selected from the group consisting of a hafnium oxide and a zirconium oxide.

4. The capacitor according to claim 1, wherein
the dielectric layer is a layer of a paraelectric material.

5. The capacitor according to claim 1, wherein
the at least one element has a concentration distribution along a thickness direction of the dielectric layer having a highest peak concentration within the dielectric layer.

6. The capacitor according to claim 1, wherein
the capacitor includes a first interface, which is an interface between the dielectric layer and the first electrode and a second interface, which is an interface between the dielectric layer and the second electrode, and the at least one element is distributed in the dielectric layer from the first interface to the second interface.

7. The capacitor according to claim 1, wherein
an elemental percentage of the at least one element in the dielectric layer is 0.8 atomic % or more and 25 atomic % or less.

8. The capacitor according to claim 1, wherein
the first and second electrodes each include a metal nitride film.

9. The capacitor according to claim 1, wherein
the thickness of the dielectric layer is 25.2 nm or more.

10. The capacitor according to claim 1, wherein
the dielectric layer is mainly monoclinic in crystallographic structure.

11. An image sensor comprising:
a semiconductor substrate;
a photoelectric transducer; and
a capacitor disposed on the semiconductor substrate, wherein:
the capacitor includes:
a first electrode;
a second electrode facing the first electrode; and
a dielectric layer disposed between the first and second electrodes and being in contact with each of the first and second electrodes;
the dielectric layer contains at least one element selected from the group consisting of nitrogen and silicon;
the first electrode is disposed closer to the semiconductor substrate than the second electrode is;
each of the first electrode and the dielectric layer has at least one trenched shape; and
a concentration distribution of the at least one element in the dielectric layer along a thickness direction of the dielectric layer includes an upward convex portion, the upward convex portion including a local maximum at a point other than interfaces between the dielectric layer and the first and second electrodes.

12. A method for producing a capacitor, the method comprising:
forming a first electrode;
forming a dielectric layer on the first electrode;
adding at least one element selected from the group consisting of nitrogen and silicon to the dielectric layer; and
forming a second electrode on the dielectric layer,
wherein a concentration distribution of the at least one element in the dielectric layer along a thickness direction of the dielectric layer includes an upward convex portion, the upward convex portion including a local maximum at a point other than interfaces between the dielectric layer and the first and second electrodes.

13. The method according to claim 12, wherein
the adding the at least one element is performed by ion implantation.

14. The method according to claim 12, wherein
the dielectric layer is made of at least one selected from the group consisting of a hafnium oxide and a zirconium oxide.

15. The method according to claim 12, wherein
the thickness of the dielectric layer is 25.2 nm or more.

16. The method according to claim 12, wherein
the dielectric layer is mainly monoclinic in crystallographic structure.

* * * * *